United States Patent
Xu et al.

(10) Patent No.: US 8,534,985 B2
(45) Date of Patent: Sep. 17, 2013

(54) COMPONENT FEEDING DEVICE

(75) Inventors: Xiao-Ming Xu, Shenzhen (CN); Jin-Jin Song, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 196 days.

(21) Appl. No.: 13/093,855

(22) Filed: Apr. 26, 2011

(65) Prior Publication Data

US 2011/0286829 A1 Nov. 24, 2011

(51) Int. Cl.
*B65G 59/02* (2006.01)
*B65H 3/00* (2006.01)
*B65H 3/24* (2006.01)

(52) U.S. Cl.
USPC .......... 414/796.7; 414/796.1; 414/795.4; 414/795.6; 414/796.2; 414/797.4; 414/797.5; 414/797.8; 414/798; 414/798.4

(58) Field of Classification Search
USPC .......... 414/796.7, 796.5, 796.9, 795.4, 795.6, 414/796.1, 796.2, 797.4, 797.5, 797.8, 798, 414/798.4, 791.2
See application file for complete search history.

(56) References Cited

U.S. PATENT DOCUMENTS

| | | | | |
|---|---|---|---|---|
| 3,620,387 A * | 11/1971 | Elson et al. | ................. | 414/796.7 |
| 4,441,844 A * | 4/1984 | Miller | ..................... | 414/796.5 |
| 5,042,854 A * | 8/1991 | Huang | ...................... | 292/175 |
| 5,348,441 A * | 9/1994 | Takemasa et al. | ......... | 414/796.7 |
| 5,791,867 A * | 8/1998 | Kuhl | ........................ | 414/795.6 |
| 5,882,174 A * | 3/1999 | Woerner et al. | ........... | 414/788.7 |
| 7,021,887 B2 * | 4/2006 | Hoe et al. | .................... | 414/796.6 |
| 7,086,562 B2 * | 8/2006 | Peterson et al. | ............. | 221/297 |
| 7,360,984 B1 * | 4/2008 | Sugiyama et al. | ......... | 414/798.1 |
| 7,371,151 B2 * | 5/2008 | Shibata et al. | .................. | 451/11 |
| 7,544,038 B2 * | 6/2009 | Gerding et al. | ............ | 414/794.9 |
| 7,959,401 B2 * | 6/2011 | Trejo | ........................ | 414/795.8 |
| 8,061,960 B2 * | 11/2011 | Hopwood et al. | ......... | 414/795.8 |
| 2008/0003084 A1* | 1/2008 | Behnke et al. | ........... | 414/331.18 |
| 2010/0101430 A1* | 4/2010 | Abascal Albizu et al. | ...... | 99/339 |
| 2010/0104412 A1* | 4/2010 | Abascal Albizu et al. | . | 414/795.2 |

FOREIGN PATENT DOCUMENTS

| | | |
|---|---|---|
| JP | H08-20436 A | 1/1996 |
| JP | 2001-97557 A | 4/2001 |

* cited by examiner

*Primary Examiner* — Gregory Adams
*Assistant Examiner* — Lynn Schwenning
(74) *Attorney, Agent, or Firm* — Altis Law Group, Inc.

(57) ABSTRACT

A feeding device includes a support mechanism, a movable platform, a driving mechanism, a clutching mechanism, and two or more holding mechanisms. The movable platform is movably connected to the support mechanism, and loads feed trays stacked together. The driving mechanism drives the movable platform to move relative to the support mechanism. The holding mechanisms are fixed on the support mechanism, and switch from a first position to a second position. When the holding mechanisms are positioned in the first position, the holding mechanisms grasp one feed tray adjacent to a feed tray at a top of the feed trays, and the clutching mechanism clutches the feed tray at the top of the feed trays. When the holding mechanisms are positioned in the second position, the holding mechanisms separate from the feed trays.

18 Claims, 5 Drawing Sheets

COMPONENT FEEDING DEVICE

BACKGROUND

1. Technical Field

The present disclosure relates to feeding devices and, more particularly, to a feeding device for separating a plurality of feed trays that are stacked together.

2. Description of Related Art

In an automatic production line, feed trays are generally used to receive components. Before feeding the components in the feed trays, the feed trays are vertically stacked together. When a suction cup is used to clutch a single tray, it may easily clutch several trays stacked together. Therefore, stacked feed trays should be manually separated. An operator may first carry a stack of feed trays to a work table of the automatic production line, and separate the feed trays one by one. The operator can then place the components in each feed tray. However, the operator needs to repeat above-described process many times, which is fatiguing, and can cause operator errors.

Therefore, there is room for improvement within the art.

BRIEF DESCRIPTION OF THE DRAWINGS

The components in the drawings are not necessarily drawn to scale, the emphasis instead placed upon clearly illustrating the principles of the present disclosure. Moreover, in the drawings, like reference numerals designate corresponding parts throughout the several views.

DETAILED DESCRIPTION

Figure 1:
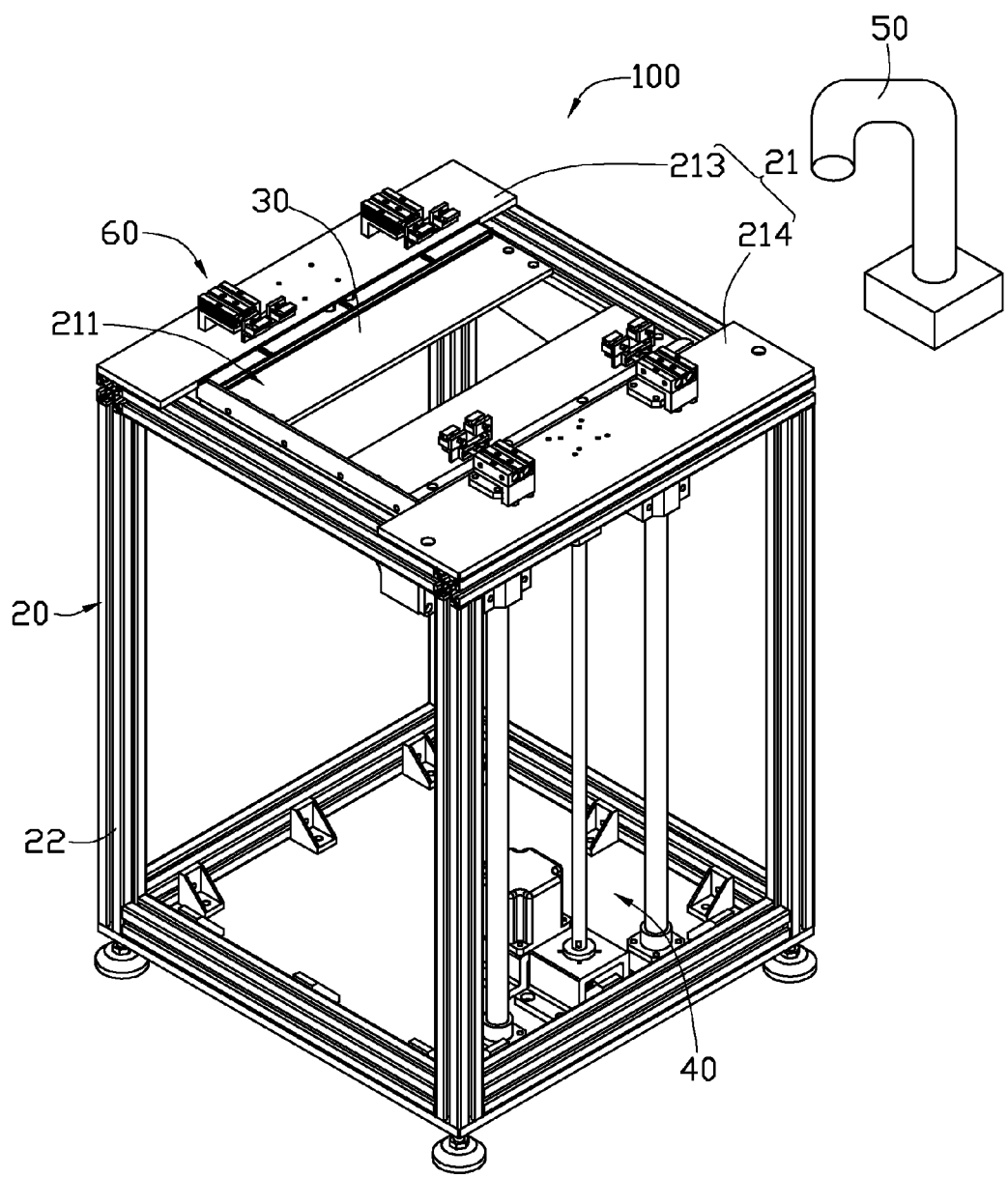
FIG. 1 is an isometric view of an embodiment of a feeding device, including a support mechanism, a movable platform, a driving mechanism, a clutching mechanism, and a plurality of holding mechanisms.
Figure 2:
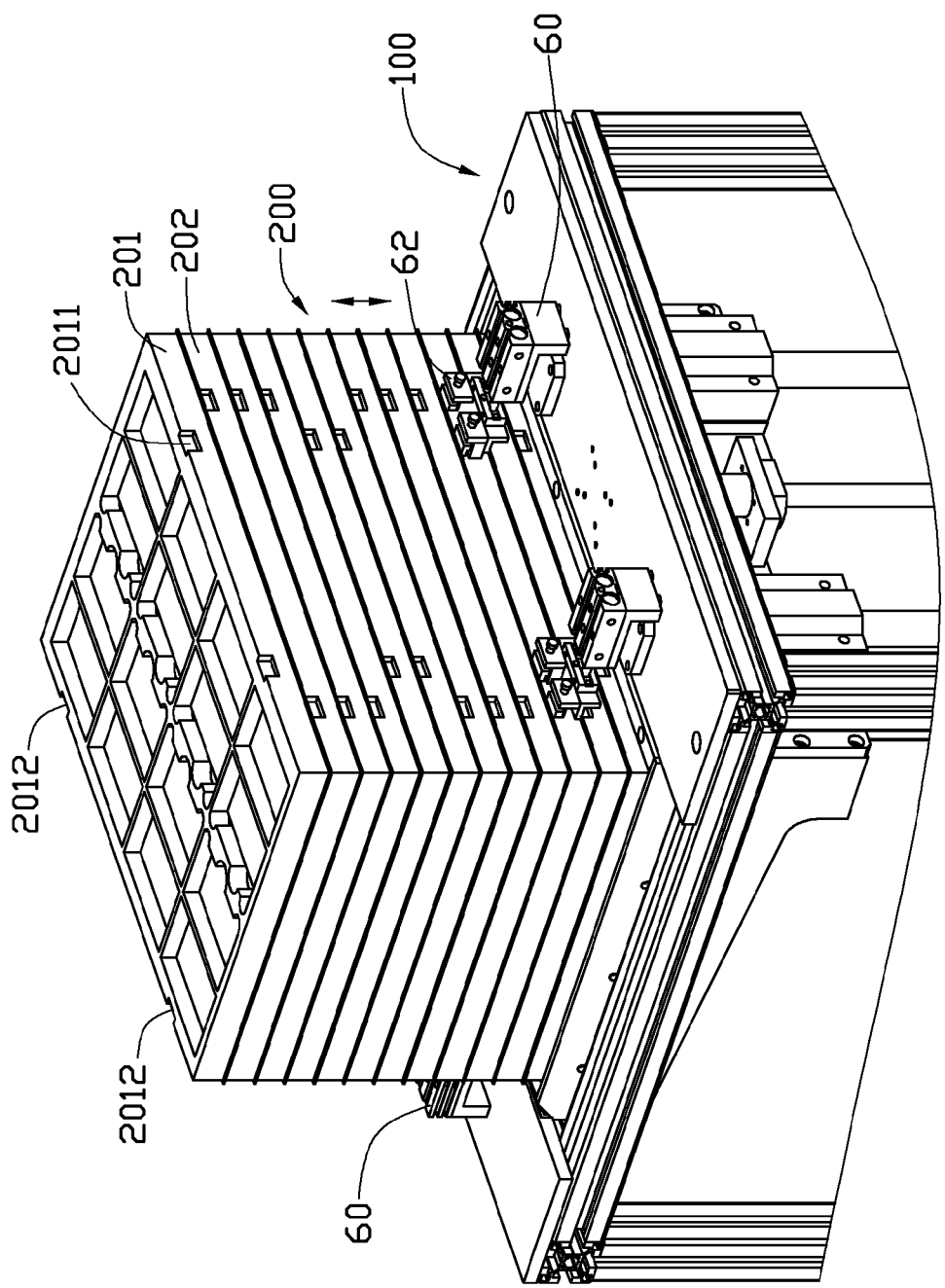
FIG. 2 is a partial, isometric view of the feeding device of FIG. 1.
Figure 3:
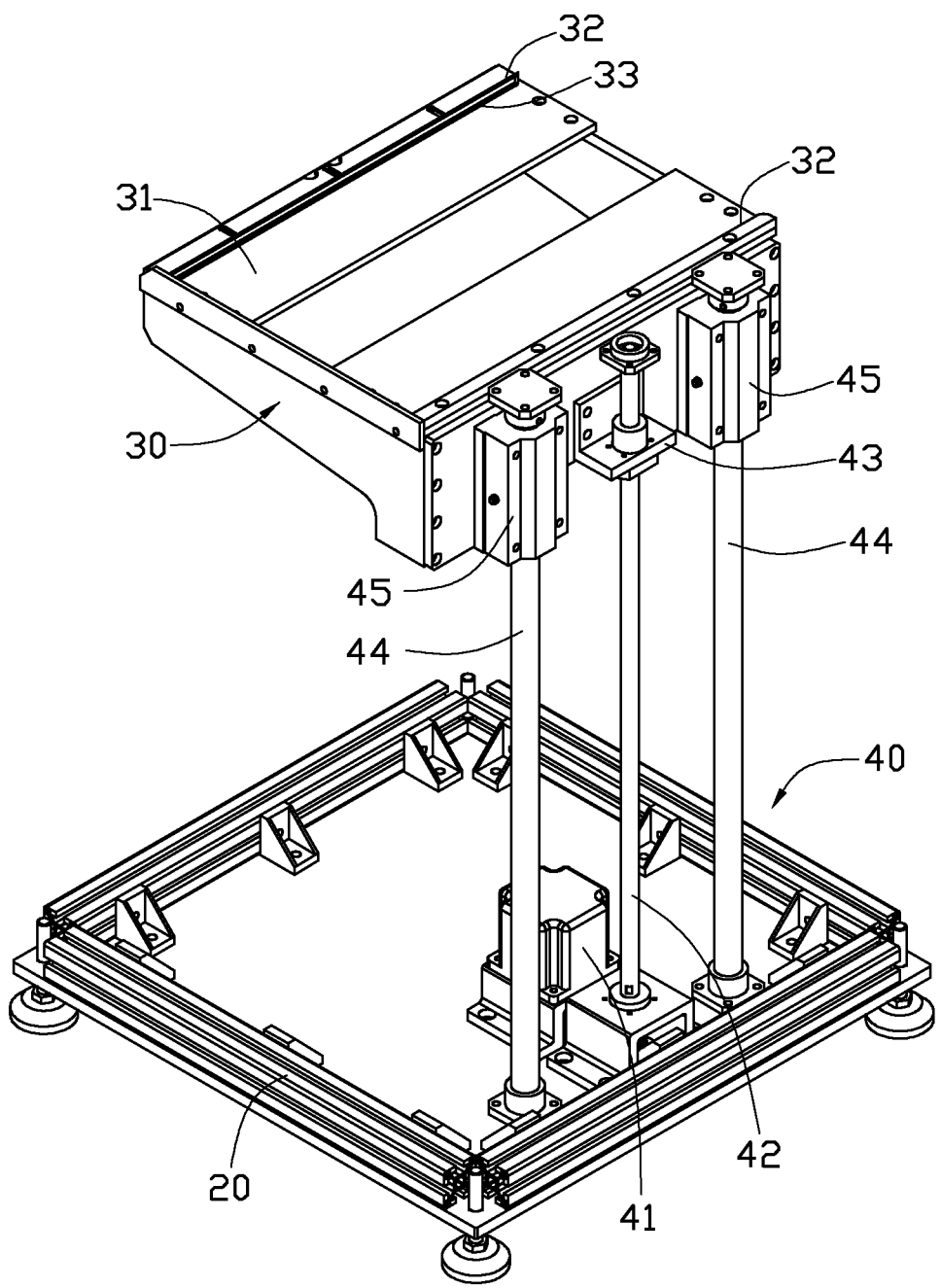
FIG. 3 is an isometric view of the movable platform and the driving mechanism of FIG. 1.

Referring to FIGS. 1 through 3, a feeding device 100 for separating a plurality of feed trays 200 vertically stacked together is shown. The feeding device 100 includes a support mechanism 20, a movable platform 30, a driving mechanism 40, a clutching mechanism 50, and a plurality of holding mechanisms 60.

The movable platform 30 is used to support the feed trays 200 including a first feed tray 201, a second feed tray 202 and so on (see FIG. 2). The holding mechanisms 60 are fixed on the support mechanism 20. The movable platform 30 can move from a first position to a second position. When the holding mechanisms 60 are in the first position, the holding mechanisms 60 grasps the second feed tray 202 adjacent to the first feed tray 201 on the top, so that the clutching mechanism 50 can detach the first feed tray 201 from the second feed tray 202. When the holding mechanisms 60 are in the second position, the holding mechanisms 60 are separated from the feed trays 200, and then the movable platform 30 is driven by the driving mechanism 40 to move in a vertical direction, until the holding mechanisms 60 are aligned with the second feed tray 202.

The support mechanism 20 includes a support plate 21 and a frame 22 for supporting the support plate 21. The support plate 21 defines a discharge opening 211. The holding mechanisms 60 are fixed on the support plate 21, and are adjacent to the discharge opening 211. In the illustrated embodiment, the support plate 21 includes a first plate 213 and a second plate 214 positioned on opposite sides of the frame 22.

Referring to FIG. 3 again, the movable platform 30 includes a bottom plate 31 and two side plates 32 formed on opposite sides of the bottom plate 31. A restricting portion 33 is formed on an inner side of each side plate 32. The movable platform 30 is configured to position the second feed tray 202. In the illustrated embodiment, the restricting portion 33 is an elongated bar.

The driving mechanism 40 drives the movable platform 30 to move in a vertical direction. The driving mechanism 40 includes a driving motor 41, a screw rod 42, and a transmission member 43. The driving motor 41 is fixed on the frame 22, and drives the screw rod 42 to rotate. The transmission member 43 is sleeved on the screw rod 42, and is fixed to the movable platform 30. The driving mechanism 40 further comprises two guiding rods 44 and two guiding sleeves 45 respectively sleeved on the guiding rods 44. The guiding rods 44 are fixed on the frame 22, and the guiding sleeves 45 are fixed to the movable platform 30.

In the illustrated embodiment, each feed tray 200 is substantially rectangular and defines two first positioning grooves 2011 in a first side, and two second positioning grooves 2012 in a second side opposite to the first side. The first positioning grooves 2011 and the second positioning grooves 2012 are not aligned in straight lines as shown in FIG. 2.

Figure 4:
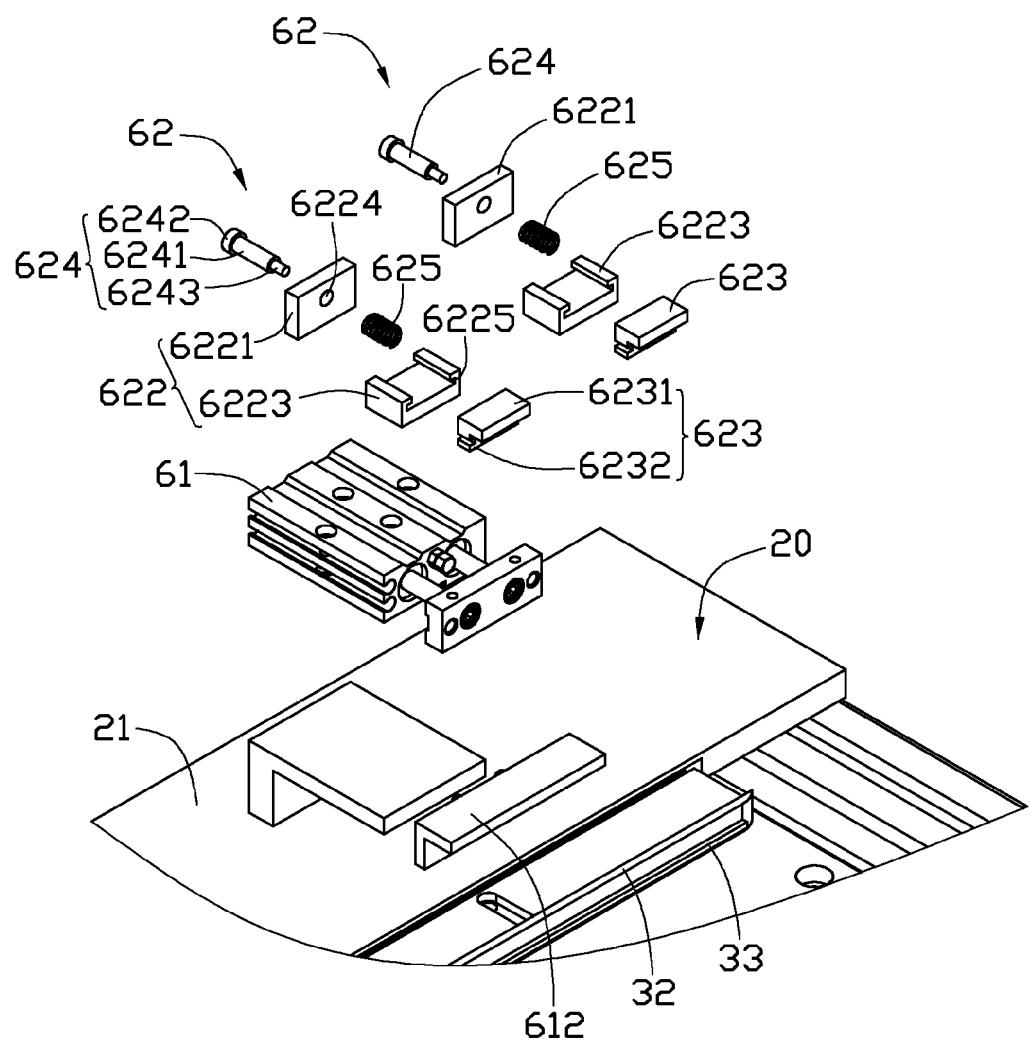
FIG. 4 is an exploded, isometric view of holding mechanisms of FIG. 1.
Figure 5:
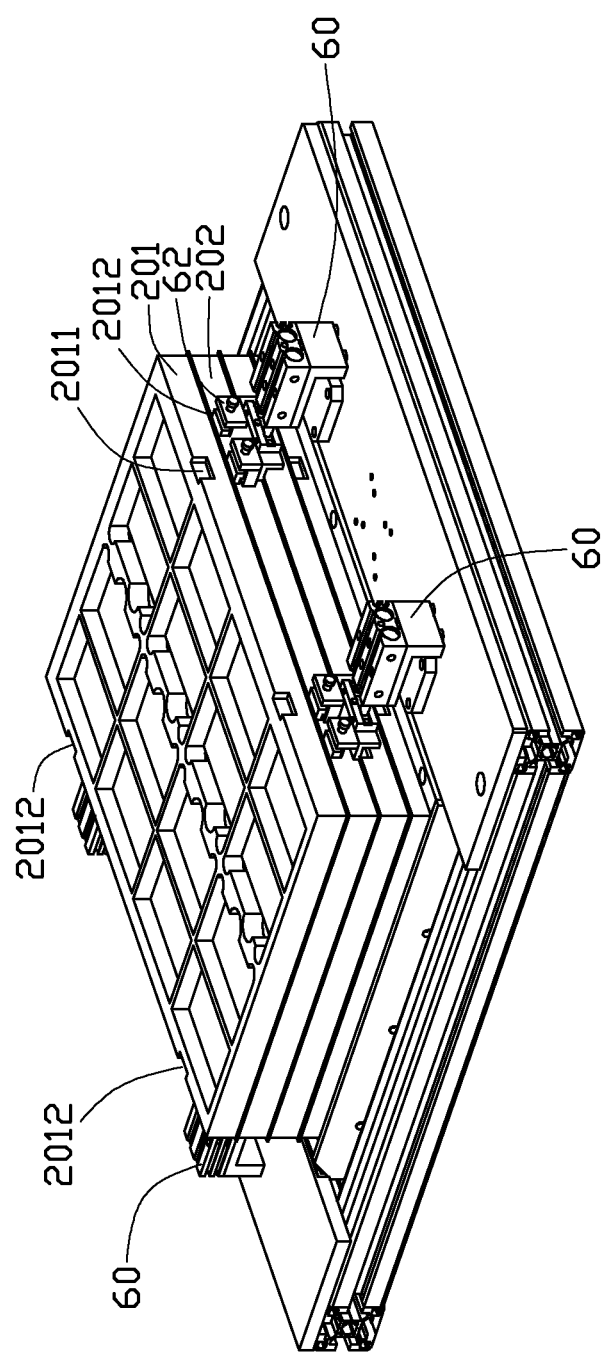
FIG. 5 is a partial, isometric view of the feeding device of FIG. 1 in a working process.

In the illustrated embodiment, the feeding device 100 includes four holding mechanisms 60 arranged in a matrix. Referring to FIG. 4, each holding mechanism 60 includes a cylinder 61, two positioning assemblies 62, and a support base 612. The positioning assemblies 62 are located corresponding to the first positioning grooves 2011 and the second positioning grooves 2012 of the feed trays 200. The cylinder 61 drives the positioning assembly 62 to move in a horizontal direction.

Each positioning assembly 62 includes a guiding assembly 622, a positioning member 623, a connecting member 624, and an elastic member 625. The guiding assembly 622 is connected to the cylinder 61. The connecting member 624 extends through the guiding assembly 622 and the elastic member 625, and is fixed to the positioning member 623. The guiding assembly 62 includes a first guiding member 6221 and a second guiding member 6223 fixed to the first guiding member 6221. The first guiding member 6221 defines a guiding hole 6224 for allowing the connecting member 624 to pass through. The second guiding member 6223 defines a guiding groove 6225 substantially parallel to the guiding hole 6224. The positioning member 623 includes a holding portion 6231 and a guide rail 6232 fixed to the holding portion 6231. The holding portion 6231 can engage in the first positioning grooves 2011 or the second positioning grooves 2012 of the feed trays 200. The guide rail 6232 is slidably received in the guiding groove 6225 of the second guiding member 6223. The connecting member 624 includes a main body 6241, a restricting head 6242, and a fixed portion 6243. The restricting head 6242 and the fixed portion 6243 extend from opposite sides of the main body 6241. The main body 624 is slidably received in the guiding hole 6224 of the first guiding member 6221, and the fixed portion 6243 is fixed to the positioning member 623. In the illustrated embodiment, the elastic member 625 is a compression spring.

Referring FIGS. 1 through 5, a work process of the feeding device 100 is described as follows. When the holding mechanisms 60 are positioned at the second position, the holding mechanisms are separated from the feed trays 200. The driving mechanism 40 drives the movable platform 30 to move a predetermined distance, such as a thickness of one feed tray 200. Thus, the first feed tray 201 reaches a predetermined position for being clutched by the clutching mechanism 50. The holding mechanisms 60 then move to the first position. The positioning assemblies 62 are driven to move towards the feed trays 200 by the cylinders 61, until one positioning assembly 62 of each holding mechanism 60 engages in the first positioning groove 2011 or the second positioning groove 2012 of the second feed tray 202, and the other one positioning assembly 62 of each holding mechanism 60 resists the side surface of the second feed tray 202. Thus, the second feed tray 202 is grasped by the holding mechanisms 60. The clutching mechanism 50 then clutches the first feed tray 201 and separates the first feed tray 201 from the second feed tray 202. The holding mechanisms 60 can then move to the second position again. Repeating the above-described steps, the feeding device 100 can separate the feed trays 200 one by one. Therefore, the feeding device 100 efficiently replaces manual labor.

It should be appreciated that the first positioning groove 2011 or the second positioning groove 2012 of the feed trays 202 may be aligned in straight lines. Correspondingly, each holding mechanisms 60 can have only one positioning assembly 62. In addition, the feeding device 100 may have two holding mechanisms 60, three holding mechanisms 60, or more than four holding mechanisms 60, depending on a shape of the feed trays 202.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A feeding device, comprising:
a support mechanism;
a movable platform movably connected to the support mechanism, and loading a plurality of feed trays stacked together thereon;
a driving mechanism driving the movable platform to move relative to the support mechanism;
a clutching mechanism clutching the feed trays one by one;
at least two holding mechanisms fixed on the support mechanism, wherein when the at least two holding mechanisms are positioned in a first position, the at least two holding mechanisms grasp one feed tray adjacent to a feed tray at a top of the feed trays, and the clutching mechanism clutches the feed tray at the top of the feed trays; when the at least two holding mechanisms are positioned in a second position, the at least two holding mechanisms separate from the feed trays;
wherein the feed tray defines at least two first positioning grooves in a first side, and at least two second positioning grooves in a second side opposite to the first side, the at least two first positioning grooves and the at least two second positioning grooves are not aligned in straight lines, each of the at least two holding mechanisms comprises a cylinder and two positioning assemblies elastically connected to the cylinder, when the two positioning assemblies are driven by the cylinder to move towards the feed tray in the first position, one of the two positioning assemblies of each holding mechanism engages in the first positioning groove or the second positioning groove, and the other one of the two positioning assemblies of each holding mechanism elastically resists a side surface of the feed tray in the first position.

2. The feeding device of claim 1, wherein each of the positioning assemblies comprises a guiding assembly, a positioning member, a connecting member, and an elastic member, the connecting member extending through the guiding assembly and the elastic member and fixed to the positioning member, and the positioning member corresponding to the at least two first or second positioning grooves of the feed tray.

3. The feeding device of claim 2, wherein the guiding assembly comprises a first guiding member and a second guiding member fixed to the first guiding member, the first guiding member defines a guiding hole; the second guiding member defines a guiding groove, and the positioning member is slidably received in the guiding groove.

4. The feeding device of claim 3, wherein the connecting member comprises a main body, a restricting head, and a fixed portion, the restricting head and the fixed portion extend from opposite sides of the main body, the main body is slidably received in the guiding hole of the first guiding member, and the fixed portion is fixed to the positioning member.

5. The feeding device of claim 1, wherein the movable platform comprises a bottom plate and two side plates formed on opposite sides of the bottom plate, and a restricting portion is formed on an inner side of each of the side plates.

6. The feeding device of claim 5, wherein the restricting portion is an elongated bar.

7. The feeding device of claim 1, wherein the driving mechanism comprises a driving motor, a screw rod, and a transmission member, the driving motor is fixed on the support mechanism and drives the screw rod to rotate; the transmission member is sleeved on the screw rod, and fixed to the movable platform.

8. The feeding device of claim 7, wherein the driving mechanism further comprises two guiding rods and two guiding sleeves respectively sleeved on the guiding rods, the guiding rods are fixed on the support mechanism, and the guiding sleeves are fixed to the movable platform.

9. The feeding device of claim 1, wherein the support mechanism comprises a support plate and a frame supporting the support plate, the support plate defines a discharge opening, and the at least two holding mechanism holding mechanisms are adjacent to the discharge opening.

10. A feeding device, comprising:
a support mechanism;
a movable platform movably connected to the support mechanism, and loading a plurality of feed trays stacked together thereon;
a driving mechanism driving the movable platform to move in a vertical direction relative to the support mechanism;
a clutching mechanism clutching the feed trays one by one;
at least two holding mechanisms fixed on opposite sides of the support mechanism, wherein each of the at least two holding mechanisms comprises a cylinder and two positioning assemblies elastically connected to the cylinder, and the cylinder drives the two positioning assemblies to move in a horizontal direction;
wherein the feed tray defines at least two first positioning grooves in a first side, and at least two second positioning grooves in a second side opposite to the first side, the at least two first positioning grooves and the at least two second positioning grooves are not aligned in straight lines, when the two positioning assemblies are driven to move towards the feed tray, one of the two positioning assemblies of each holding mechanism engages in the first positioning groove or the second positioning groove, and the other one of the two positioning assemblies of each holding mechanism elastically resists a side surface of the feed tray.

11. The feeding device of claim 10, wherein each of the positioning assembly comprises a guiding assembly, a positioning member, a connecting member, and an elastic member, the connecting member extending through the guiding assembly and the elastic member, and fixed to the positioning member, and the positioning member corresponding to the at least two first or second positioning grooves of the feed tray.

12. The feeding device of claim 11, wherein the guiding assembly comprises a first guiding member and a second guiding member fixed to the first guiding member, the first guiding member defines a guiding hole; the second guiding member defines a guiding groove, and the positioning member is slidably received in the guiding groove.

13. The feeding device of claim 12, wherein the connecting member comprises a main body, a restricting head, and a fixed portion, the restricting head and the fixed portion extend from opposite sides of the main body, the main body is slidably received in the guiding hole of the first guiding member, and the fixed portion is fixed to the positioning member.

14. The feeding device of claim 10, wherein the movable platform comprises a bottom plate and two side plates formed on opposite sides of the bottom plate, and a restricting portion is formed on an inner side of each of the side plates.

15. The feeding device of claim 14, wherein the restricting portion is an elongated bar.

16. The feeding device of claim 10, wherein the driving mechanism comprises a driving motor, a screw rod, and a transmission member, the driving motor is fixed on the support mechanism, and drives the screw rod to rotate; the transmission member is sleeved on the screw rod, and fixed to the movable platform.

17. The feeding device of claim 16, wherein the driving mechanism further comprises two guiding rods and two guiding sleeves respectively sleeved on the guiding rods, the guiding rods are fixed on the support mechanism, and the guiding sleeves are fixed to the movable platform.

18. The feeding device of claim 10, wherein the support mechanism comprises a support plate and a frame supporting the support plate, the support plate defines a discharge opening, and the at least two holding mechanisms are adjacent to the discharge opening.

* * * * *